(12) United States Patent
Kubo et al.

(10) Patent No.: US 12,347,707 B2
(45) Date of Patent: Jul. 1, 2025

(54) SEMICONDUCTOR ANALYSIS SYSTEM

(71) Applicant: Hitachi High-Tech Corporation, Tokyo (JP)

(72) Inventors: Yudai Kubo, Tokyo (JP); Tsunenori Nomaguchi, Tokyo (JP); Hiroyuki Chiba, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 379 days.

(21) Appl. No.: 17/797,225

(22) PCT Filed: Feb. 27, 2020

(86) PCT No.: PCT/JP2020/008056
§ 371 (c)(1),
(2) Date: Aug. 3, 2022

(87) PCT Pub. No.: WO2021/171490
PCT Pub. Date: Sep. 2, 2021

(65) Prior Publication Data
US 2023/0063192 A1 Mar. 2, 2023

(51) Int. Cl.
*H01L 21/67* (2006.01)
*G05B 19/418* (2006.01)
(Continued)

(52) U.S. Cl.
CPC .. *H01L 21/67276* (2013.01); *G05B 19/41875* (2013.01); *H01J 37/20* (2013.01);
(Continued)

(58) Field of Classification Search
CPC ........ H01J 37/20; H01J 37/244; H01J 37/265; H01J 37/28; H01J 37/305;
(Continued)

(56) References Cited

U.S. PATENT DOCUMENTS

2002/0074496 A1 6/2002 Sadayama
2002/0137350 A1 9/2002 Endoh et al.
(Continued)

FOREIGN PATENT DOCUMENTS

CN 1979119 A 6/2007
JP 2-132345 A 5/1990
(Continued)

OTHER PUBLICATIONS

International Search Report (PCT/ISA/210) issued in PCT Application No. PCT/JP2020/008056 dated May 12, 2020 with English translation (six (6) pages).
(Continued)

*Primary Examiner* — David E Smith
(74) *Attorney, Agent, or Firm* — Crowell & Moring LLP

(57) ABSTRACT

A semiconductor analysis system includes a machining device that machines semiconductor wafer to prepare a thin film sample for observation, a transmission electron microscope device that acquires a transmission electron microscope image of the thin film sample, and a host control device that controls the machining device and the transmission electron microscope device. The host control device evaluates the thin film sample based on the transmission electron microscope image, updates machining conditions based on an evaluation result of the thin film sample, and outputs the updated machining conditions to the machining device.

9 Claims, 14 Drawing Sheets

(51) Int. Cl.
  *H01J 37/20* (2006.01)
  *H01J 37/244* (2006.01)
  *H01J 37/26* (2006.01)
  *H01J 37/28* (2006.01)
  *H01J 37/305* (2006.01)

(52) U.S. Cl.
  CPC .......... *H01J 37/244* (2013.01); *H01J 37/265* (2013.01); *H01J 37/28* (2013.01); *H01J 37/305* (2013.01); *G05B 2219/32368* (2013.01); *H01J 2237/0473* (2013.01); *H01J 2237/221* (2013.01); *H01J 2237/24578* (2013.01); *H01J 2237/2802* (2013.01); *H01J 2237/31749* (2013.01)

(58) Field of Classification Search
  CPC ......... H01J 2237/0473; H01J 2237/221; H01J 2237/24578; H01J 2237/2802; H01J 2237/31749; G05B 19/41875; G05B 2219/32368
  See application file for complete search history.

(56) References Cited

U.S. PATENT DOCUMENTS

| | | | |
|---|---|---|---|
| 2007/0158566 A1 | 7/2007 | Ikeda | |
| 2010/0116977 A1* | 5/2010 | Young | H01J 37/3056 250/311 |
| 2013/0277552 A1* | 10/2013 | Nanri | H01J 37/304 250/311 |
| 2017/0062178 A1* | 3/2017 | Arjavac | H01J 37/3045 |
| 2018/0261423 A1 | 9/2018 | Watanabe et al. | |

FOREIGN PATENT DOCUMENTS

| | | |
|---|---|---|
| JP | 2002-174571 A | 6/2002 |
| JP | 2009-115582 A | 5/2009 |
| JP | 2010-9987 A | 1/2010 |
| JP | 2014-22296 A | 2/2014 |
| JP | 2014022296 A * | 2/2014 |
| JP | 2015-38509 A | 2/2015 |
| JP | 2017-69186 A | 4/2017 |
| JP | 2018-152165 A | 9/2018 |
| TW | 538242 B | 6/2003 |
| TW | 679409 B | 12/2019 |

OTHER PUBLICATIONS

Japanese-language Written Opinion (PCT/ISA/237) issued in PCT Application No. PCT/JP2020/008056 dated May 12, 2020 (five (5) pages).

Taiwanese-language Office Action issued in Taiwanese Application No. 110103633 dated Dec. 13, 2021 (eight (8) pages).

* cited by examiner

[FIG. 1]
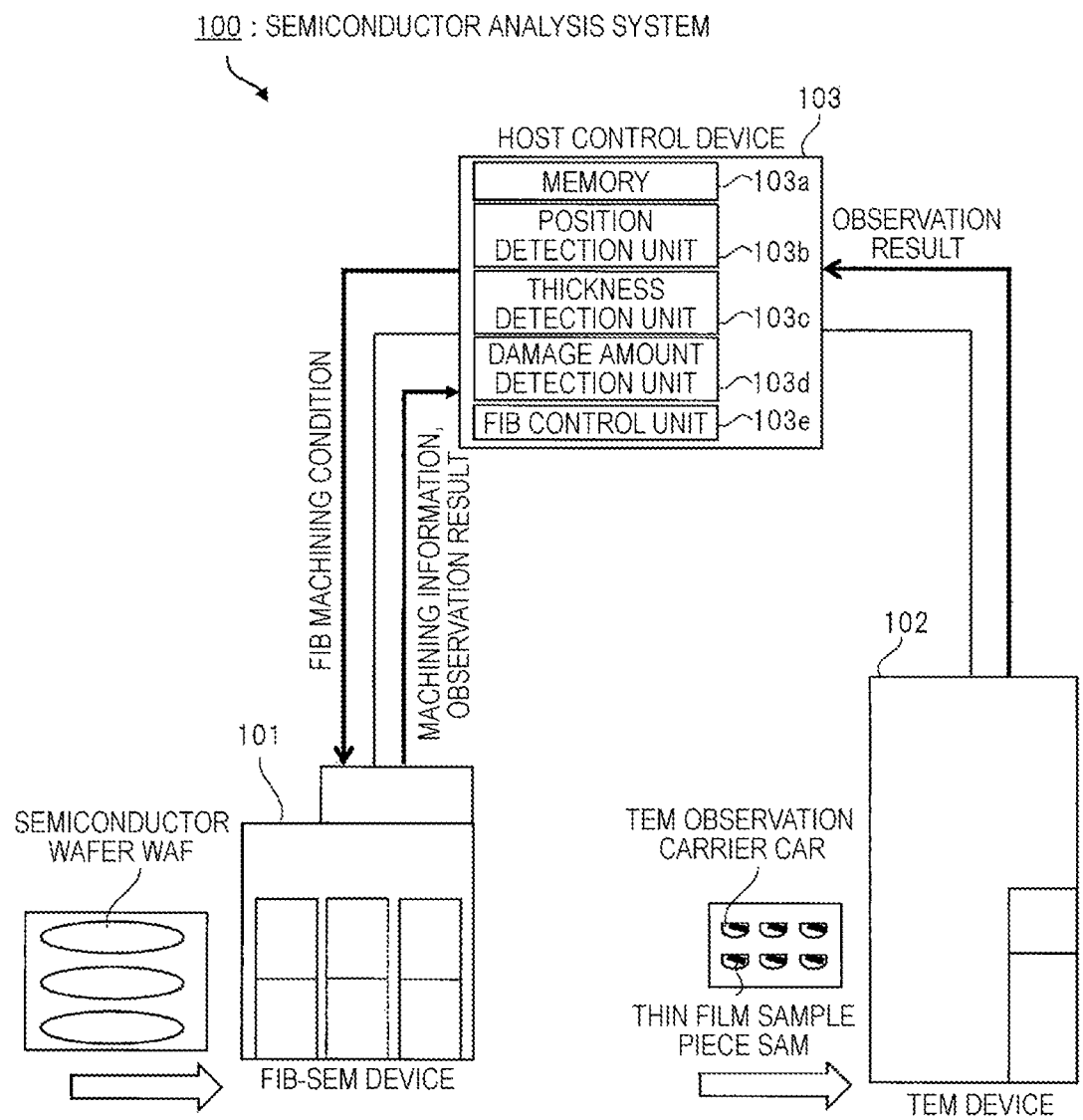

[FIG. 2]
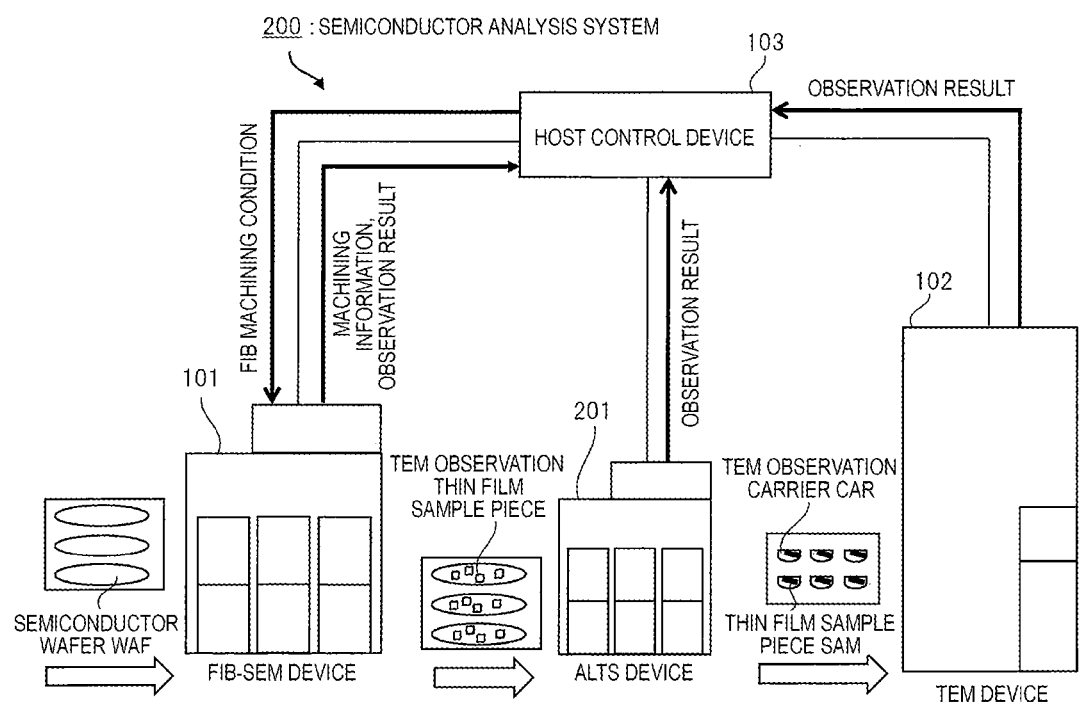

[FIG. 3]
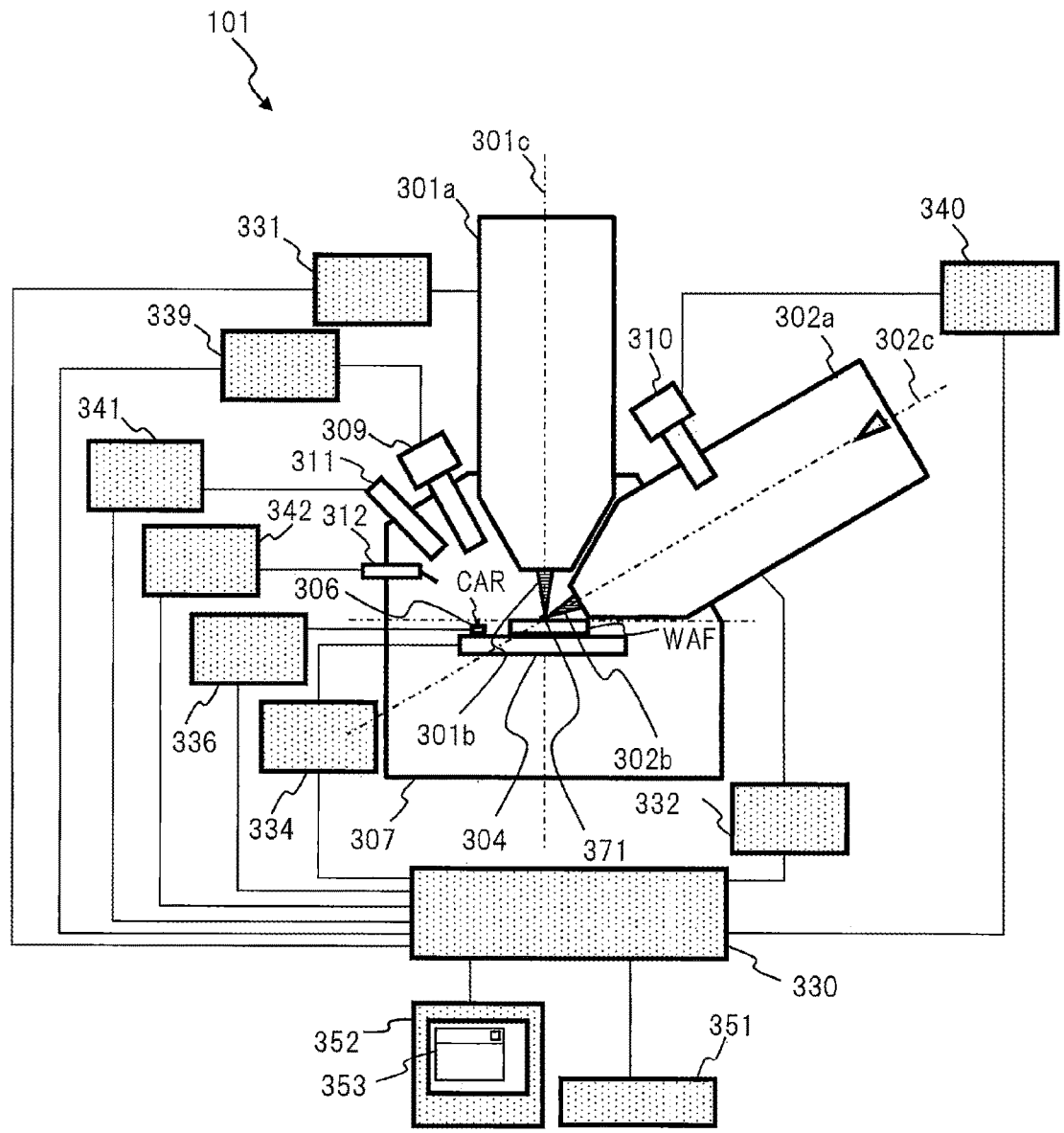

[FIG. 4]
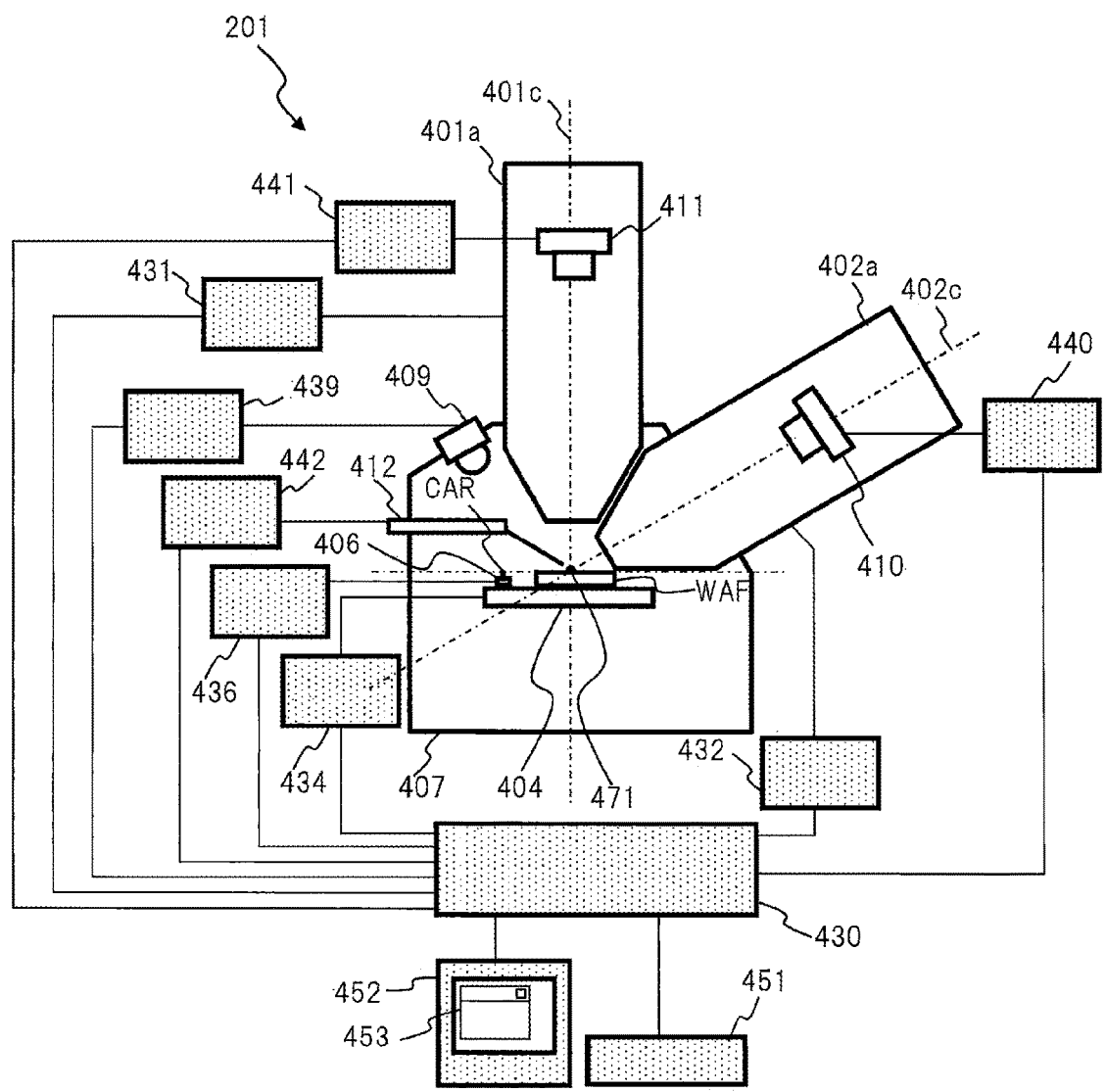

[FIG. 5]
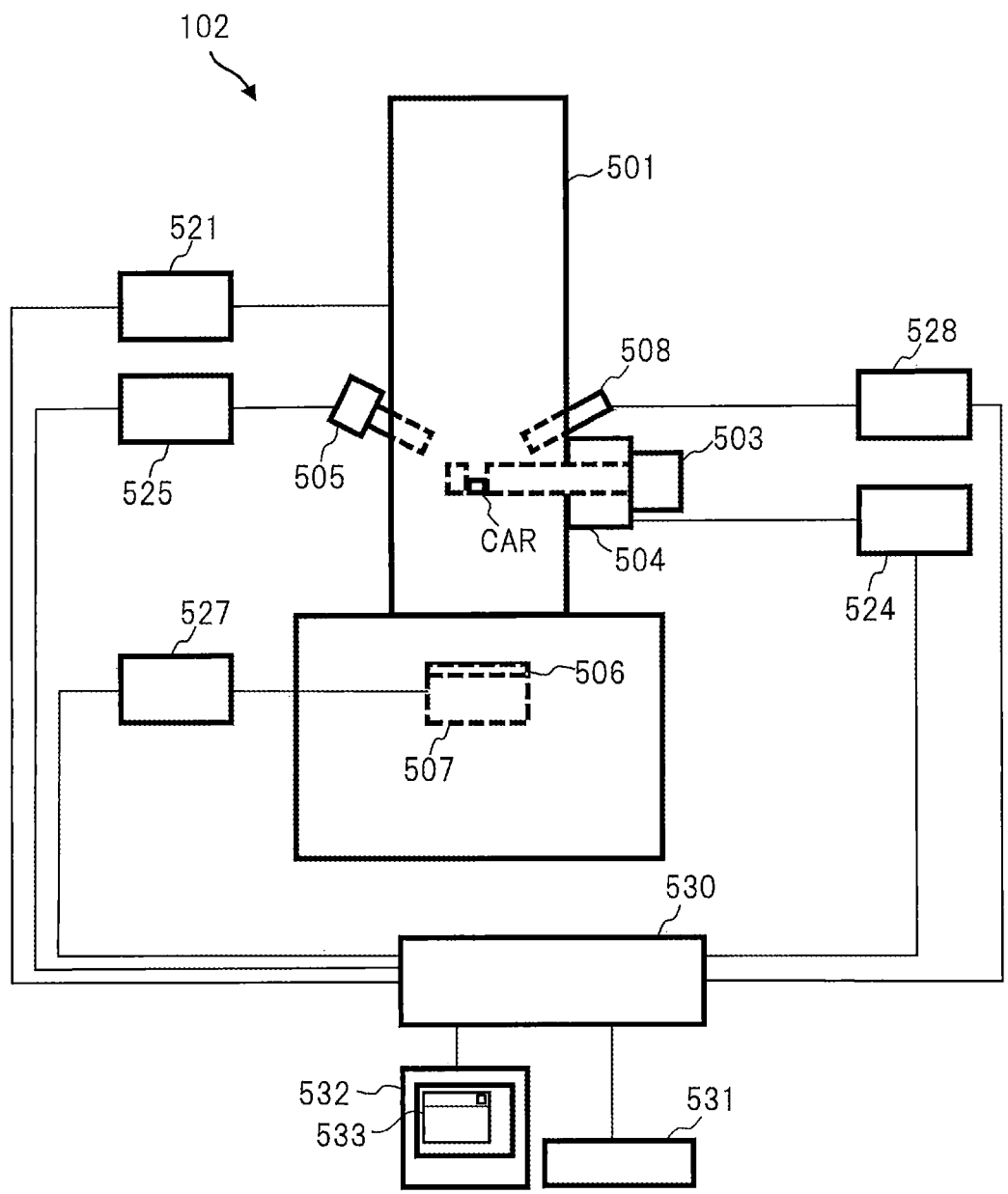

[FIG. 6]
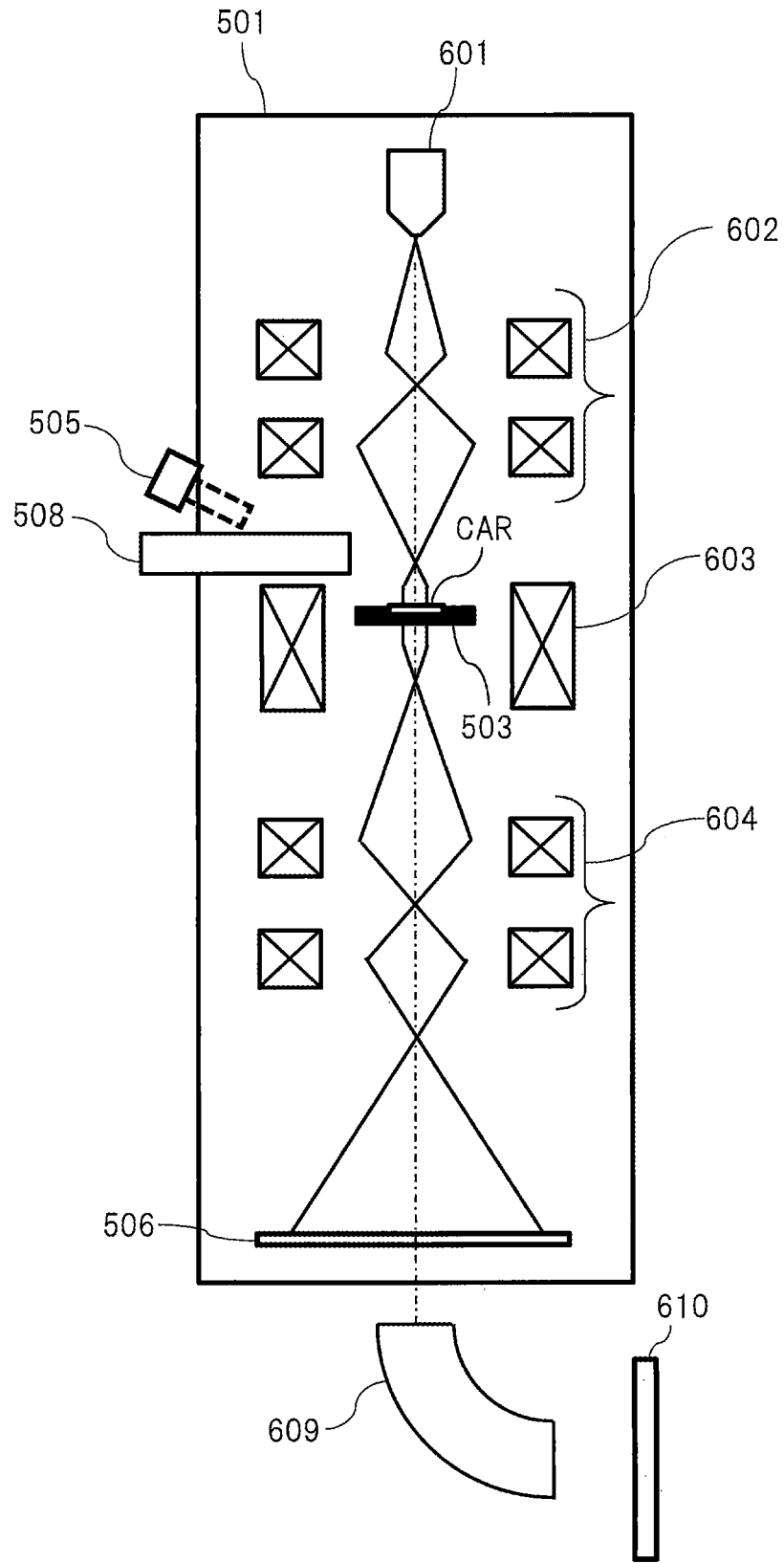

[FIG. 7]
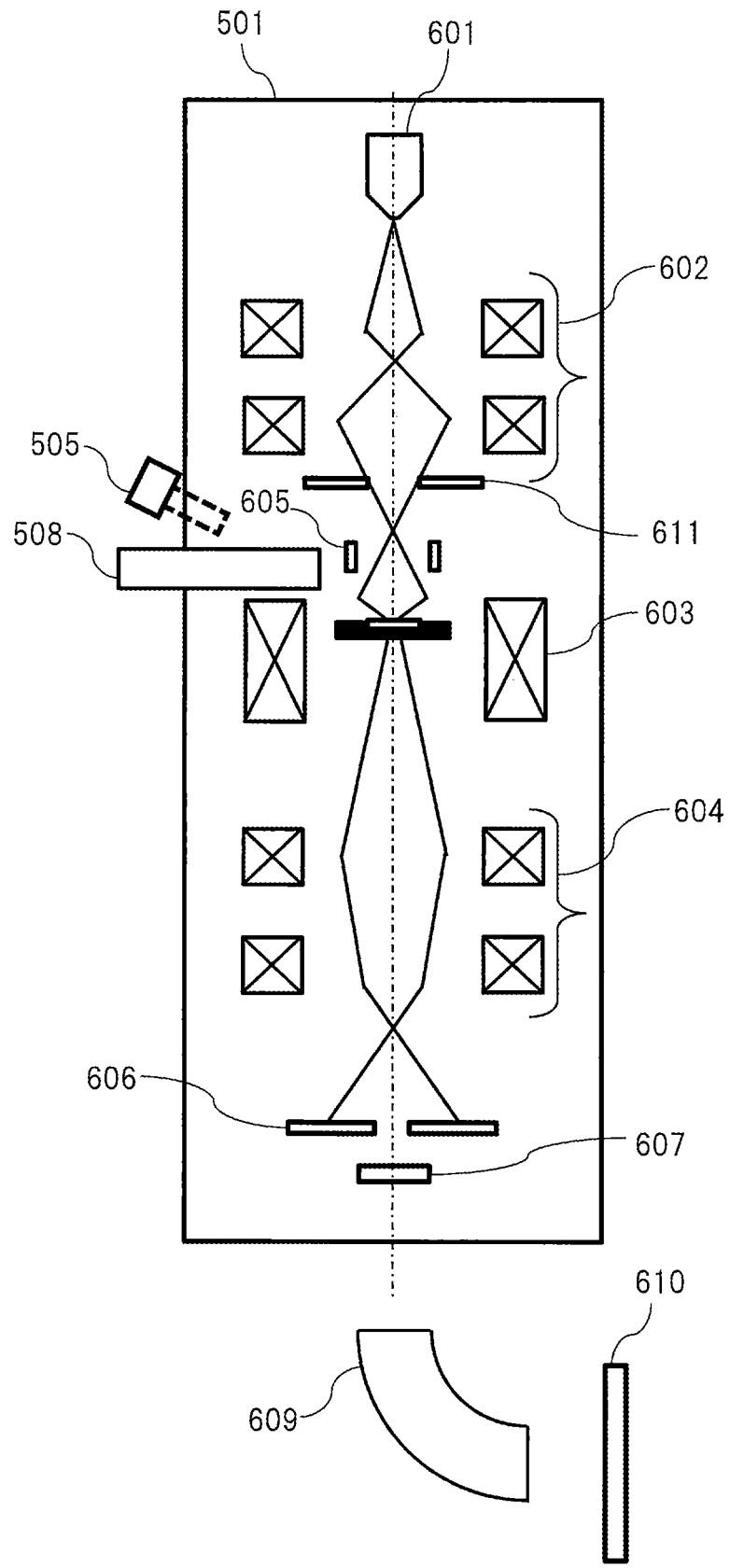

[FIG. 8]
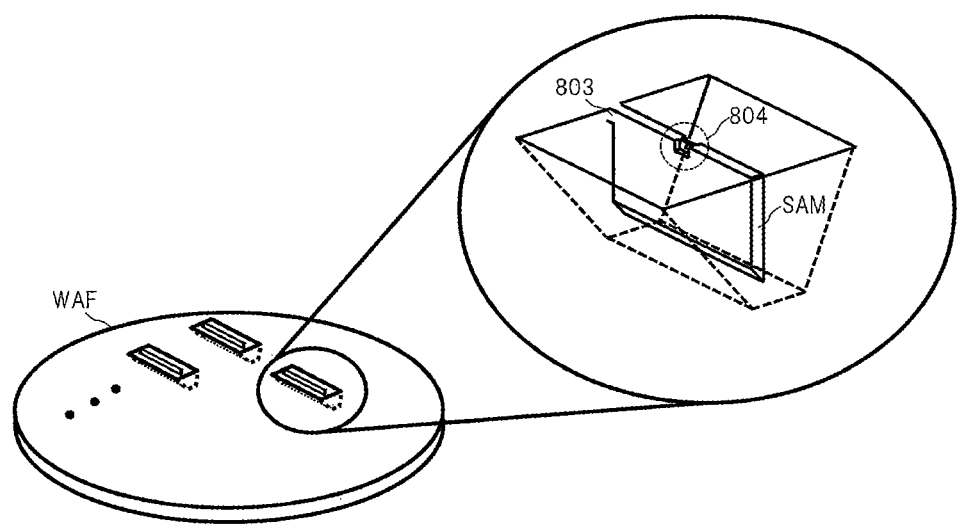

[FIG. 10]
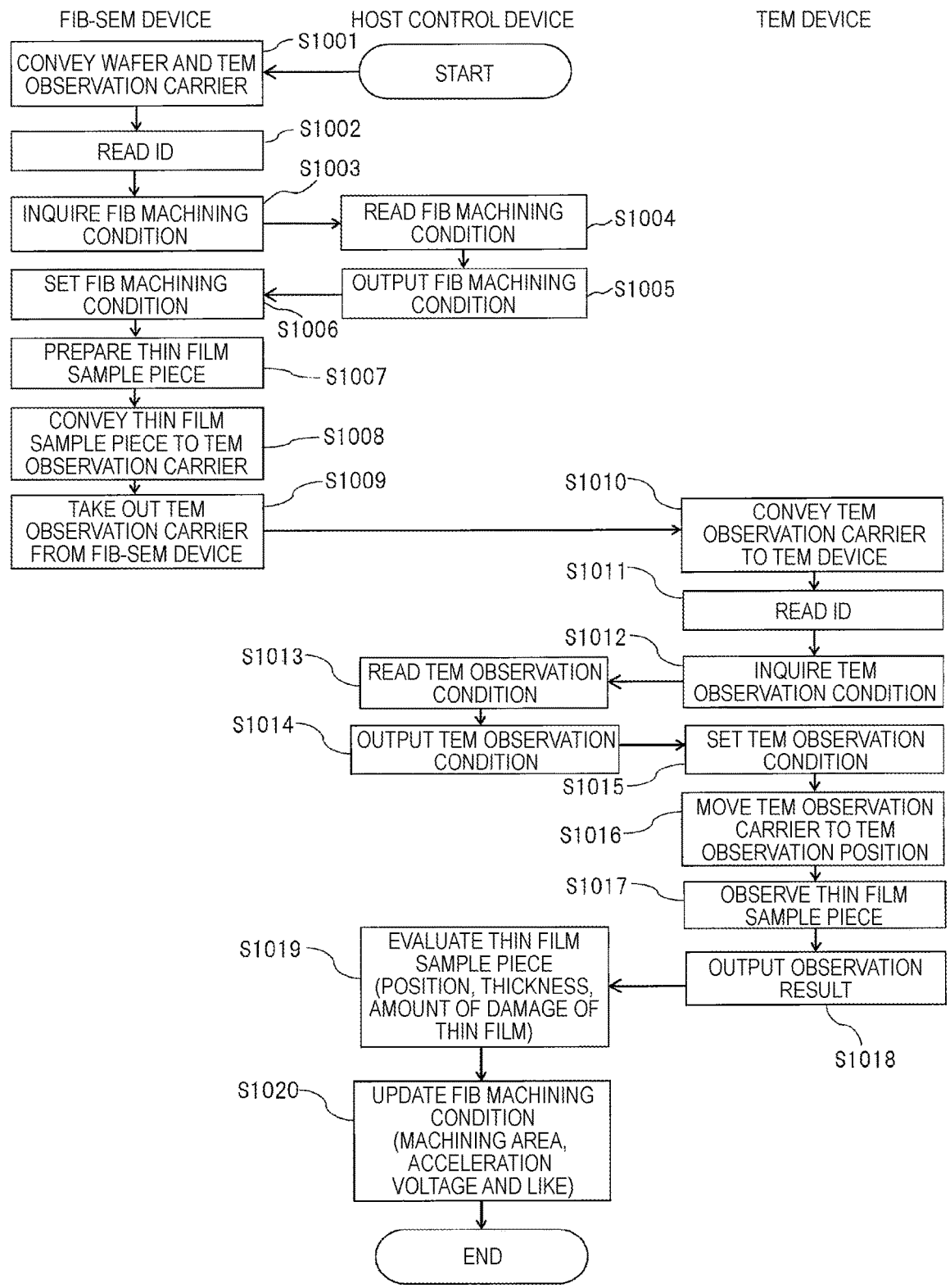

[FIG. 12]
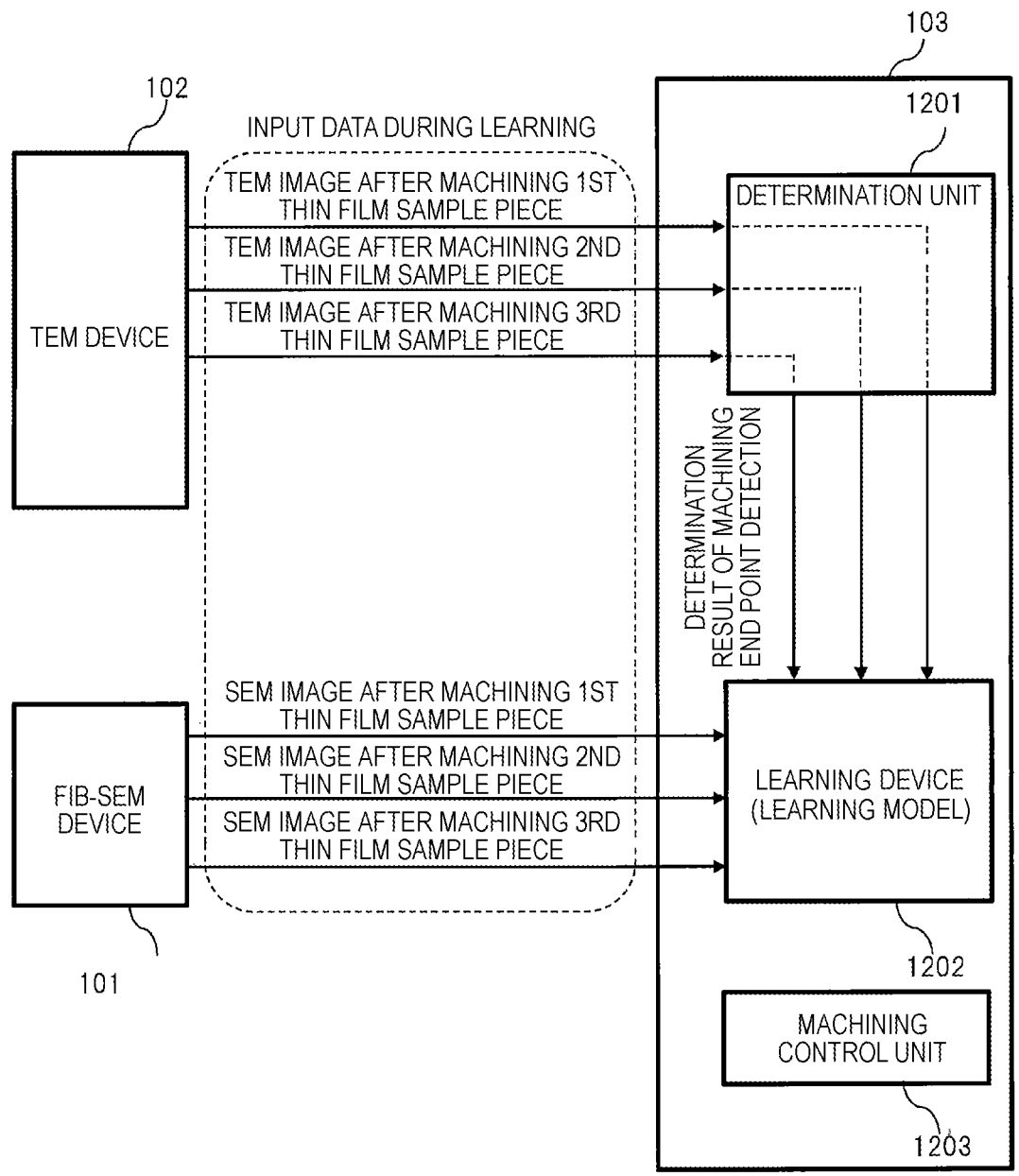

[FIG. 13]
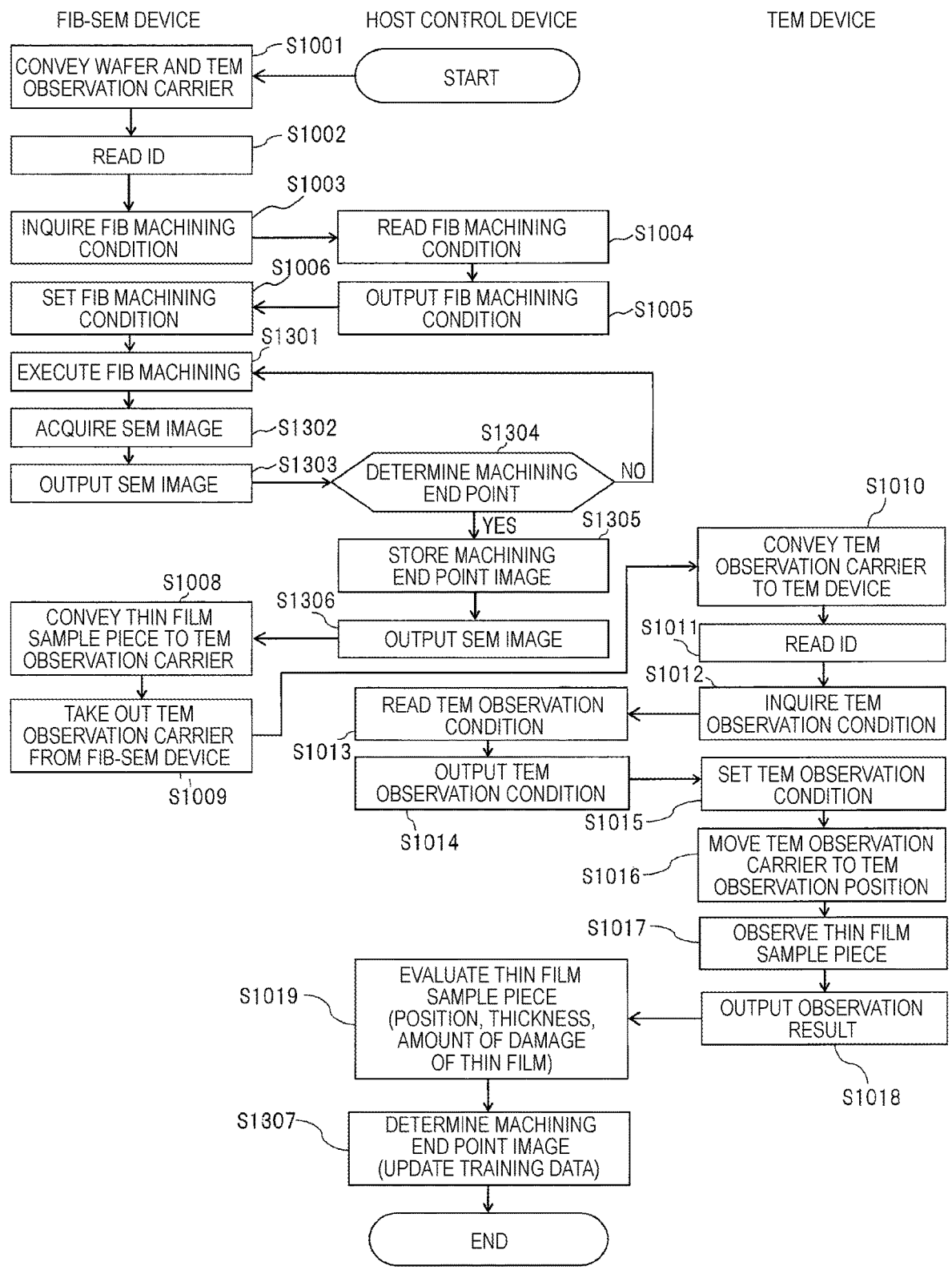

[FIG. 14]
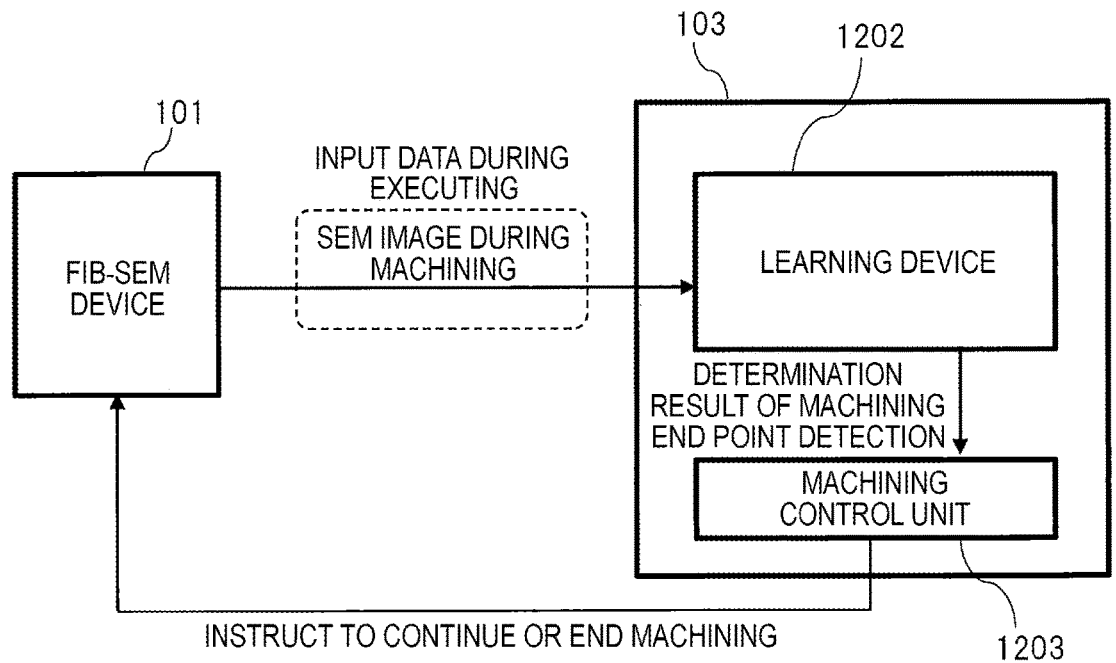

SEMICONDUCTOR ANALYSIS SYSTEM

TECHNICAL FIELD

The present invention relates to a semiconductor analysis system.

BACKGROUND ART

A method for preparing an observation sample of a transmission electron microscope (TEM) by using a FIB-SEM device equipped with a focused ion beam (FIB) and a scanning electron microscope (SEM) is widely known. Specifically, in the FIB-SEM device, a thin film sample for TEM analysis is cut out as an observation sample from a desired area on the semiconductor wafer, and structural analysis and defect analysis of the observation sample are carried out by TEM. Further, by feeding back the result of analysis of the observation sample to the machining conditions, an improvement in the accuracy of preparation of observation sample is achieved.

For example, in JP-A-2009-115582 (PTL 1), there is disclosed a method for improving productivity in the preparation of a sample for the transmission electron microscope, by eliminating a need for use of deposition when fixing a thin sample prepared by machining with a charged particle beam to a sample holder.

CITATION LIST

Patent Literature

PTL 1: JP-A-2009-115582

SUMMARY OF INVENTION

Technical Problem

The need for observing semiconductor devices using an electron microscope is fast increasing. This gives rise to a need for automation of thin film sample preparation for semiconductor wafers by a FIB-SEM device, and automation of thin film sample observation by electron microscope. However, the recent semiconductor devices are continuously miniaturized and with their structures becoming more complex, the required level of automation is increasing year by year.

Therefore, an object of the present invention is to improve the accuracy of automatic preparation of thin film sample and the accuracy of automatic observation of the thin film sample.

Solution to Problem

The following briefly describes the outline of a representative example of the invention disclosed in the present application.

A semiconductor analysis system according to a representative embodiment of the present invention includes a machining device that machines semiconductor wafer to prepare a thin film sample for observation, a transmission electron microscope device that acquires a transmission electron microscope image of the thin film sample, and a host control device that controls the machining device and the transmission electron microscope device. The host control device evaluates the thin film sample based on the transmission electron microscope image, updates machining conditions based on an evaluation result of the thin film sample, and outputs the updated machining conditions to the machining device.

Advantageous Effects of Invention

The effect obtained by a representative example of the invention disclosed in the present application will be briefly described as follows.

That is, according to a representative embodiment of the present invention, it is possible to improve the accuracy of automatic preparation of the thin film sample and the accuracy of automatic observation of the thin film sample.

BRIEF DESCRIPTION OF DRAWINGS

FIG. 1 is a schematic configuration diagram showing an example of a semiconductor analysis system according to a first embodiment of the present invention.

FIG. 2 is a schematic configuration diagram showing another example of the semiconductor analysis system according to the first embodiment of the present invention.

FIG. 3 is a schematic configuration diagram showing an example of a FIB-SEM device according to the first embodiment of the present invention.

FIG. 4 is a schematic configuration diagram showing an example of an ALTS device of FIG. 2.

FIG. 5 is a schematic configuration diagram showing an example of a TEM device according to the first embodiment of the present invention.

FIG. 6 is a schematic configuration diagram showing an example of an electron beam column and its surroundings when used in a TEM mode.

FIG. 7 is a schematic configuration diagram showing an example of an electron beam column and its surroundings when used in a STEM mode.

FIG. 8 is a conceptual diagram of a thin film sample prepared on a semiconductor wafer.

FIG. 10 is a flow chart showing an example of a semiconductor analysis method according to the first embodiment of the present invention.

FIG. 12 is a diagram illustrating a semiconductor analysis system according to a second embodiment of the present invention.

FIG. 13 is a flow chart showing an example of a method for updating training data according to the second embodiment of the present invention.

FIG. 14 is a diagram illustrating a method for determining a machining end point detection using a learning model.

DESCRIPTION OF EMBODIMENTS

Figure 9A:
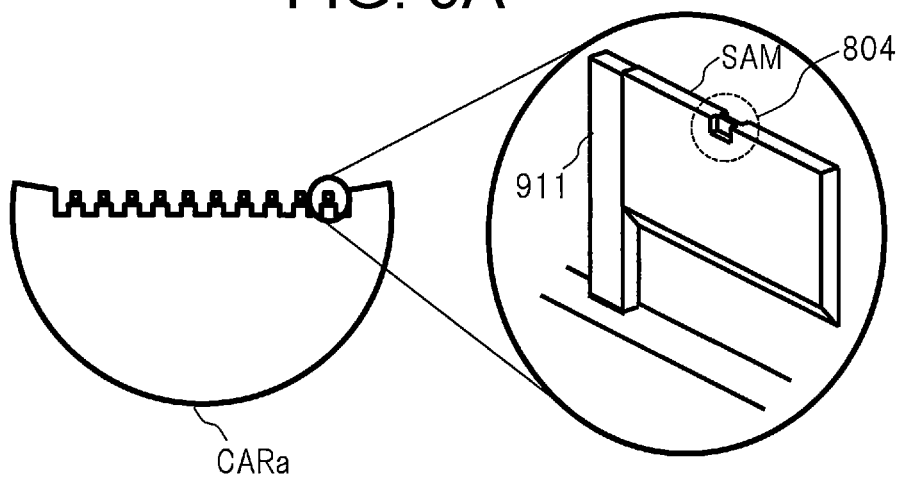
FIGS. 9A to 9C are schematic diagrams of a thin film sample mounted on a TEM observation carrier.

Hereinafter, embodiments of the present invention will be described with reference to the drawings. Each of the embodiments described below is an example for realizing the present invention, and is not to be construed as limiting the technical scope of the present invention. In addition, throughout the embodiments, the members having the same functions are designated by the same reference numerals, and the repeated description thereof will be omitted unless particularly necessary.

First Embodiment

<Configuration of Semiconductor Analysis System>

FIG. 1 is a schematic configuration diagram showing an example of a semiconductor analysis system according to a first embodiment of the present invention. A semiconductor analysis system 100 includes a FIB-SEM device (machining device) 101, a TEM device 102, and a host control device 103. Here, the SEM refers to the scanning electron microscope. In addition, the TEM refers to the transmission electron microscope, and STEM, which will be described below, refers to the scanning transmission electron microscope.

The FIB-SEM device 101 is a device that includes a FIB device that prepares (cuts out) a thin film sample SAM for observation from a semiconductor wafer WAF, and a SEM device that observes the semiconductor wafer WAF or the prepared thin film sample SAM. Note that, in the present embodiment, the SEM device may not be included.

The TEM device 102 is a device that performs structural analysis and defect analysis of the thin film sample SAM. The TEM device 102 acquires a TEM image (transmission electron microscope image) of the thin film sample SAM by diffraction contrast or phase contrast. In addition, the TEM device 102 may have the structure and function of the STEM device. In this case, the TEM device 102 may acquire a HAADF image as a STEM image (scanning transmission electron microscope image) of the thin film sample SAM. The FIB-SEM device 101 and the TEM device 102 can communicate with each other via the host control device 103.

The host control device 103 is a device that controls the FIB-SEM device 101 and the TEM device 102. The host control device 103 performs basic control such as operation start and stop of the FIB-SEM device 101 and the TEM device 102, output of FIB machining conditions for the semiconductor wafer WAF, output of TEM observation conditions of the thin film sample SAM prepared by FIB machining, and the like. Further, the host control device 103 performs evaluation of the prepared thin film sample SAM based on the TEM image (STEM image) output from the TEM device 102, update of the FIB machining conditions based on the evaluation result, and the like. The configuration of each device included in the semiconductor analysis system 100 will be described in detail below.

The main processing in the semiconductor analysis system 100 is as follows. In the FIB-SEM device 101, the thin film sample SAM is prepared (cut out) from the semiconductor wafer WAF conveyed in the device by using the FIB device. The prepared thin film sample SAM is placed on a TEM observation carrier CAR. The TEM observation carrier CAR, with the thin film sample SAM placed thereon, is conveyed from the FIB-SEM device 101 to the TEM device 102, and the TEM device 102 performs structural analysis and defect analysis of the thin film sample SAM.

In the present embodiment, the host control device 103 is described as an independent component, but the FIB-SEM device 101, or the TEM device 102, may be responsible for some or all of the functions of the host control device 103.

Note that the semiconductor wafer WAF may be conveyed with a container that can accommodate a plurality of wafers, or may be conveyed while being placed on a cartridge that can be inserted into the FIB-SEM device 101. Further, the TEM observation carrier CAR may be conveyed with a container that can accommodate a plurality of carriers, or may be conveyed while being placed on a cartridge that can be inserted into the TEM device 102. In addition, some or all of the handling tasks for the semiconductor wafer WAF and the TEM observation carrier CAR may be performed by human or conveyance robot.

FIG. 2 is a schematic configuration diagram showing another example of the semiconductor analysis system according to the first embodiment of the present invention. A semiconductor analysis system 200 of FIG. 2 has a configuration in which an Auto Lamella Transfer System (ALTS) device 201 is added to the semiconductor analysis system 100 of FIG. 1. The ALTS device 201 is a device that automatically transfers the thin film sample SAM prepared (cut out) on the semiconductor wafer WAF to the TEM observation carrier CAR.

The FIB-SEM device 101, the ALTS device 201, and the TEM device 102 can communicate with each other via the host control device 103.

The semiconductor wafer WAF with the thin film sample SAM prepared thereon is conveyed to the ALTS device 201. The ALTS device 201 transfers the thin film sample SAM to the TEM observation carrier CAR in the device. At that time, the ALTS device 201 performs the transfer while referring to the position information of the thin film sample SAM on the semiconductor wafer WAF.

In addition, the conveyance of the semiconductor wafer WAF to the ALTS device 201 may be performed for each container or cartridge described above. Further, as described above, some or all of the handling tasks for the semiconductor wafer WAF and the TEM observation carrier CAR may be performed by human or conveyance robot.

In the example of FIG. 2, the host control device is described as an independent component, but the FIB-SEM device 101, the TEM device 102, and the ALTS device 201 may be responsible for some or all of the functions of the host control device 103.

<Configuration of FIB-SEM Device>

FIG. 3 is a schematic configuration diagram showing an example of the FIB-SEM device according to the first embodiment of the present invention. As shown in FIG. 3, the FIB-SEM device 101 includes an ion beam column 301a, an ion beam column controller 331 that controls the ion beam column 301a, an electron beam column 302a, an electron beam column controller 332 that controls the electron beam column 302a, a wafer stage 304 on which a semiconductor wafer WAF can be placed, and a wafer stage controller 334 that controls the wafer stage 304.

Further, the FIB-SEM device 101 includes a substage 306 on which a TEM observation carrier CAR can be placed, a substage controller 336 that controls the substage 306, a probe unit 312 for picking up the thin film sample SAM prepared on the semiconductor wafer WAF, a probe unit controller 342 that controls the probe unit 312, and a sample chamber 307.

Further, the FIB-SEM device 101 includes charged particle detectors 309 and 310 that detect charged particles generated when an ion beam 301b or an electron beam 302b is applied to the thin film sample SAM on the semiconductor wafer WAF or the TEM observation carrier CAR, a detector controller 339 that controls the charged particle detector 309, a detector controller 340 that controls the charged particle detector 310, an X-ray detector 311, an X-ray detector controller 341 that controls the X-ray detector 311, and an integrated computer 330 that controls the operations of the entire FIB-SEM device 101. The integrated computer 330 and each controller can communicate with each other.

Further, the FIB-SEM device 101 includes a controller 351 (keyboard, mouse, and the like) for the operator to input various instructions and the like such as irradiation conditions of an ion beam or an electron beam and the position of the wafer stage 304, a GUI screen 353 for controlling the FIB-SEM device 101, one or a plurality of displays 352 and the like that display the state of the FIB-SEM device 101, various acquired information and the like including images, and the like. The state of the FIB-SEM device 101, the acquired information, and the like may be included in the GUI screen 353.

The ion beam column 301a is a system that includes all the components necessary for FIB, such as an ion source for generating an ion beam, a lens for focusing the ion beam, a deflection system for scanning and shifting the ion beam, a blanking deflection system for blanking the ion beam, and the like.

The electron beam column 302a is a system that includes all the components necessary for SEM, such as an electron source for generating an electron beam, a lens for focusing the electron beam, a deflection system for scanning and shifting the electron beam, a blanking deflection system for blanking the electron beam, and the like.

The ion beam column 301a and the electron beam column 302a are mounted on the sample chamber 307. The ion beam 301b passed through the ion beam column 301a and the electron beam 302b passed through the electron beam column 302a are mainly focused on the intersection (cross point 371) of an optical axis 301c of the ion beam column 301a and an optical axis 302c of the electron beam column 302a.

While gallium ions are generally used for the ion beam 301b, specific ion types for the purpose of machining do not matter herein. Further, the ion beam 301b is not limited to the focused ion beam, and may be a broad ion beam provided with a mask.

In the present embodiment, the ion beam column 301a is arranged vertically and the electron beam column 302a is arranged in an inclined manner, but embodiments are not limited to such an arrangement. For example, the ion beam column 301a may be arranged in an inclined manner, and the electron beam column 302a may be arranged vertically. Further, the ion beam column 301a and the electron beam column 302a may be arranged in an inclined manner.

The FIB-SEM device 101 according to the present embodiment may have a triple column configuration including a gallium focused ion beam column, an argon focused ion beam column, and an electron beam column.

Further, a device combining the FIB device with an observation system such as an optical microscope or an AFM instead of the electron beam column may be used in place of the FIB-SEM device 101. Alternatively, machining and observation may be performed using only the ion beam column. In this case, the number of columns for generating a beam can be reduced, and the device cost can be reduced.

The wafer stage 304 and the substage 306 can move in a plane or rotationally under the control of the corresponding wafer stage controller 334 and substage controller 336. Further, the wafer stage 304 and the substage 306 move a predetermined position in the semiconductor wafer WAF or the thin film sample SAM required for machining by the ion beam or observation to the ion beam irradiation position or to the observation position by the electron beam.

The probe unit 312 picks up the thin film sample SAM prepared on the semiconductor wafer WAF. When picking up the thin film sample SAM, the probe unit 312 may use tweezers (not shown) instead of the probe. Further, the probe unit 312 may come into contact with a surface of the semiconductor wafer WAF to supply the potential to the semiconductor wafer.

The detector controllers 339 and 340 are functional blocks that arithmetically process and image the detection signals output from the corresponding charged particle detectors 309 and 310, and include an arithmetic processing unit that is implemented in the processor by executing a predetermined circuit or program.

The charged particle detectors 309 and 310 may include a composite charged particle detector capable of detecting electrons and ions.

In addition to the elements described above, a gas injection unit (not shown) and the like are mounted in the sample chamber 307. Further, the FIB-SEM device 101 has each controller (not shown) that controls the gas injection unit and the like. The gas injection unit stores deposition gas for forming a deposit film on the semiconductor wafer WAF or the thin film sample SAM by irradiation with a charged particle beam, and supplies it into the sample chamber 307 from a nozzle tip (not shown) as needed. As a result, a protective film or marking can be prepared at any position on the semiconductor wafer WAF, the thin film sample SAM, and the TEM observation carrier CAR.

Further, the sample chamber 307 may store an etching gas that is chemically corroded or etched by irradiation with the charged particle beam. This etching gas may be used for machining the semiconductor wafer WAF.

Further, the sample chamber 307 may be equipped with a cold trap, an optical microscope, or the like. Further, in the sample chamber 307, a detector such as a tertiary electron detector, a STEM detector, a backscattering electron detector, a low energy loss electron detector, or the like may be provided in addition to the charged particle detector 309. Further, the sample chamber 307 may be equipped with a mass spectrometer or the like in addition to the X-ray detector 311.

<Configuration of ALTS Device>

FIG. 4 is a schematic configuration diagram showing an example of the ALTS device of FIG. 2. As shown in FIG. 4, the ALTS device 201 includes a first optical microscope 401a, a first optical microscope controller 431 that controls the first optical microscope 401a, a second optical microscope 402a, a second optical microscope controller 432 that controls the second optical microscope 402a, a wafer stage 404 on which the semiconductor wafer WAF can be placed, and a wafer stage controller 434 that controls the wafer stage 404.

Further, the ALTS device 201 includes a substage 406 on which a TEM observation carrier CAR can be placed, a substage controller 436 that controls the substage 406, a probe unit 412 that picks up a thin film sample SAM prepared on a semiconductor wafer WAF, a probe unit controller 442 that controls the probe unit 412, and a sample chamber 407.

Further, the ALTS device 201 includes a first camera 410 and a second camera 411 for acquiring an optical microscope image, a first camera controller 440 that controls the first camera 410, a second camera controller 441 that controls the second camera 411, a light source 409 for irradiating the thin film sample SAM with light, a light source controller 439 that controls the light source 409, and an integrated computer 430 that controls the overall operations of the ALTS device 201. The integrated computer 430 and each controller can communicate with each other.

Further, the ALTS device 201 includes a controller 451 (keyboard, mouse, and the like) for the operator to input various instructions such as irradiation conditions, the position of the wafer stage 404, and the like, a GUI screen 453 for controlling the ALTS device 201, and one or a plurality of displays 452 and the like that display the state of the ALTS device 201, various acquired information including images, and the like. The state of the ALTS device 201, the acquired information, and the like may be included in the GUI screen 453.

The first optical microscope 401a and the second optical microscope 402a are systems that include all the components necessary for the optical microscope, such as a lens for forming an image, an aperture for limiting an opening, and the like. In FIG. 4, the light source 409 is provided in the sample chamber 407, but embodiments are not limited to such a configuration. For example, the light source 409 may be provided inside the optical microscope, so that the thin film sample SAM is irradiated from above.

Further, the ALTS device 201 may be configured to include a mechanism for scanning the focused light on the thin film sample SAM such that a scanned image can be acquired. Further, the thin film sample SAM to be observed is mainly observed at a position (cross point 471) where an optical axis 401c of the first optical microscope 401a and an optical axis 402c of the second optical microscope 402a intersect with each other. This makes it possible to check the 3D positional relationship of the observation target. For example, it is possible to accurately check the positional relationship between the thin film sample SAM on the semiconductor wafer WAF and the probe unit 412 and tweezers (not shown). Further, in FIG. 4, the sample chamber 407 is provided, but since a closed space is not required when observing in the atmosphere, the sample chamber 407 can be omitted.

The wafer stage 404 and the substage 406 can move in a plane or rotationally under the control of the corresponding wafer stage controller 434 and the substage controller 436. Further, the probe unit 412 may not only pick up the thin film sample SAM prepared on the semiconductor wafer WAF, but also have functions such as a contact detection sensor on the wafer surface, a stress sensor, and the like. Further, in order to pick up the thin film sample SAM, tweezers may be used instead of the probe.

In FIG. 4, while the first optical microscope 401a and the second optical microscope 402a are arranged in the sample chamber 407, the type of the microscope is not particularly limited for the purpose of observing the thin film sample SAM. For example, SEM devices may be used for some or all microscopes. In this case, a configuration similar to that in FIG. 3 can be considered. For example, a configuration may be considered, in which a second electron beam column is mounted in the sample chamber 307 instead of the ion beam column 301a in FIG. 3. Further, in this case, for the electron source of the electron beam column used in the ALTS device 201, any one of a field emission type, a schottky type, and a thermionic type may be adapted.

<Configuration of TEM Device>

FIG. 5 is a schematic configuration diagram showing an example of the TEM device according to the first embodiment of the present invention. The TEM device 102 of FIG. 5 can be used in a TEM mode, or can be used in a STEM mode by switching the mode.

As shown in FIG. 5, the TEM device 102 includes an electron beam column 501, an electron beam column controller 521 that controls the electron beam column 501, a sample holder 503 on which a TEM observation carrier CAR is placed, a sample holder stage 504 that drives the sample holder 503, and a holder stage controller 524 that controls the sample holder stage 504.

Further, the TEM device 102 includes a secondary electron detector 505 that detects electrons emitted from the thin film sample SAM, a detector controller 525 that controls the secondary electron detector 505, a fluorescent plate 506 that projects a transmission electron microscope image, a camera 507 that captures an image of the fluorescent plate 506, a camera controller 527 that controls the camera 507, an X-ray detector 508 that detects X-rays emitted from the thin film sample SAM, an X-ray detector controller 528 that controls the X-ray detector 508, and an integrated computer 530 that controls the overall operations of the TEM device 102. The integrated computer 530 and each controller can communicate with each other.

Further, the TEM device 102 includes a controller 531 (keyboard, mouse, and the like) for inputting various instructions such as irradiation conditions, the position of the holder stage 504, and the like, a GUI screen 533 for controlling the TEM device 102, and one or a plurality of displays 532 and the like that display the state of the TEM device 102, various acquired information including images, and the like. The state of the TEM device 102, the acquired information, and the like may be included in the GUI screen 533.

FIG. 6 is a schematic configuration diagram showing an example of the electron beam column and its surroundings when used in the TEM mode. As shown in FIG. 6, the electron beam column 501 includes an electron source 601 for generating an electron beam, an irradiation lens group 602 for irradiating the thin film sample SAM with the electron beam, an objective lens 603, a projection lens group 604 that projects the electron beam that has passed through the thin film sample SAM, and the like. Further, below the electron beam column 501, an electron energy loss spectroscope (EELS) 609, a detector 610 for the EELS, and the like are arranged.

As described above, all the elements necessary for analysis using the TEM device 102 are mounted on the electron beam column 501 and its surroundings. As shown in FIG. 6, in the TEM mode, the electron beam is spread over the entire observation area on the thin film sample SAM and is irradiated thereon, and sample information is acquired from a projected image, an interference image, a diffraction pattern, or the like.

FIG. 7 is a schematic configuration diagram showing an example of the electron beam column and its surroundings when used in the STEM mode. As shown in FIG. 7, the electron beam column 501 in the STEM mode has a configuration in which a deflection system 605 for scanning and shifting the electron beam and a diaphragm 611 for controlling the opening angle of the electron beam are added to each of the main elements of FIG. 6. Further, instead of the fluorescent plate 506 of FIG. 6, an annular detector 606 for detecting transmitted electrons scattered at a wide angle, and a transmitted electron detector 607 for detecting electrons transmitted through the thin film sample SAM are provided. As shown in FIG. 7, in the STEM mode, the electron beam is focused on the thin film sample SAM and scans the observation area to acquire the sample information.

In the TEM mode and the STEM mode, a cold trap may be disposed in the vicinity of the thin film sample SAM, or the sample holder 503 may be provided with a cooling mechanism, a heating mechanism, a gas introduction mechanism, and the like.

<Configuration of Host Control Device>

As shown in FIG. 1, the host control device 103 includes a memory 103a, a position detection unit 103b that detects the position of the thin film machining area where the thin film sample SAM is prepared, a thickness detection unit 103c that detects the thickness of the thin film sample SAM, a damage amount detection unit 103*d* that detects an amount of damage due to the preparation of the thin film sample SAM, and a FIB control unit 103*e*.

The memory 103*a* is a storage device including a nonvolatile memory, a hard disk, or the like. The memory 103*a* stores the FIB machining conditions corresponding to the IDs assigned to the semiconductor wafer WAF and the TEM observation carrier CAR to be described below. For example, the FIB machining conditions include acceleration voltage of the ion beam, beam current, machining area on the semiconductor wafer WAF, sequence of machining, and the like.

Further, the memory 103*a* stores the TEM observation conditions corresponding to each ID. The TEM observation conditions include a plurality of items. In the case of the TEM mode, the TEM observation conditions include an observation mode (TEM image observation, diffraction pattern observation, energy dispersive X-ray analysis (EDX analysis), electron energy loss spectroscopy analysis (EELS analysis), and the like), a TEM magnification, a camera length, a probe current amount (the size of the aperture diameter of the irradiation system), and the like, for example. In the case of STEM mode, the STEM observation conditions include an observation magnification, a probe diameter (reduction rate of the optical system), an irradiation angle to the sample, selection of the detector (transmission electron detector, annular detector, secondary electron detector, and the like), a capture angle of the detector, and the like, for example.

The position detection unit 103*b*, the thickness detection unit 103*c*, the damage amount detection unit 103*d*, and the FIB control unit 103*e* may be configured by hardware, or may be implemented on a processor by executing software, or may be configured by combining hardware and software.
<Configuration of Thin Film Sample and TEM Observation Carrier>

FIG. 8 is a conceptual diagram of a thin film sample prepared on a semiconductor wafer. In the FIB-SEM device 101, one or a plurality of thin film samples SAM are prepared on the semiconductor wafer WAF. In the present embodiment, the thin film sample SAM is connected to the semiconductor wafer WAF by one support portion 803, but the number of support portions 803 may be two or more.

In either case, when the thin film sample SAM is picked up, the support portion 803 is cut from the semiconductor wafer WAF. Cutting the support portion 803 may be performed by the FIB and may be performed by division using tweezers or the like. Further, although a TEM observation area 804 is made thinner than its surroundings, it does not necessarily have to be thinner than the surroundings as long as it has a thickness that allows TEM observation.

The size of the semiconductor wafer WAF is generally 100 mm to 300 mm, the size of the thin film sample SAM is several μm to several tens of μm, the thickness of the thin film sample SAM is several μm, and the thickness of the TEM observation area 804 is several nm to several tens of nm.

Figure 9B:
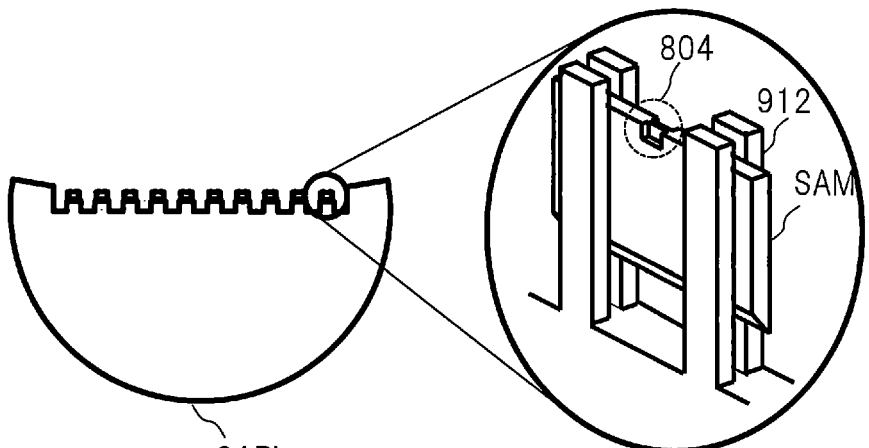
Figure 9C:
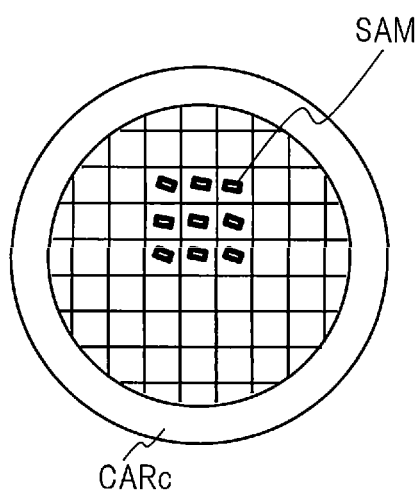
Figure 11A:
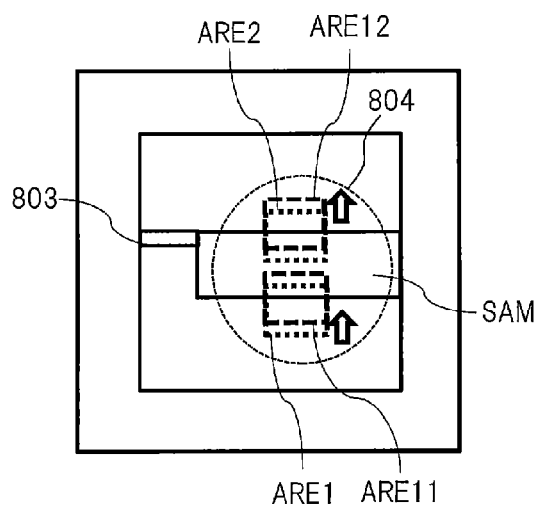
FIGS. 11A to 11D are diagrams illustrating a method for updating FIB machining condition.
Figure 11B:
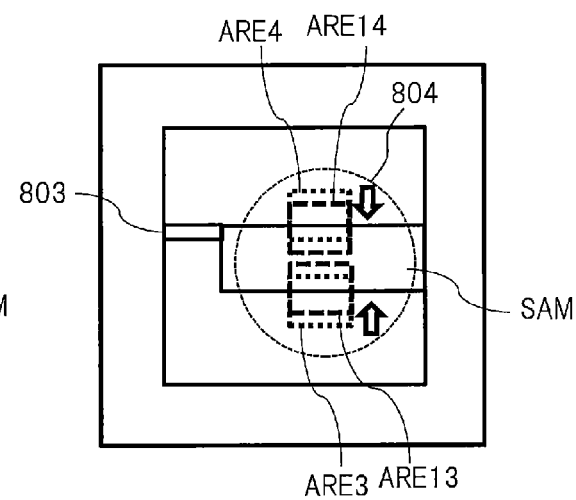
Figure 11C:
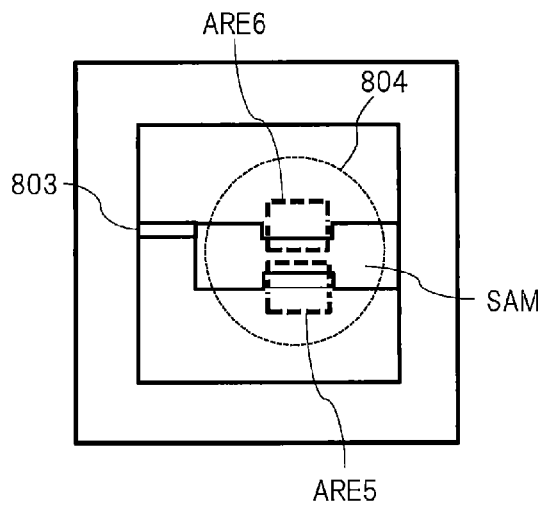
Figure 11D:
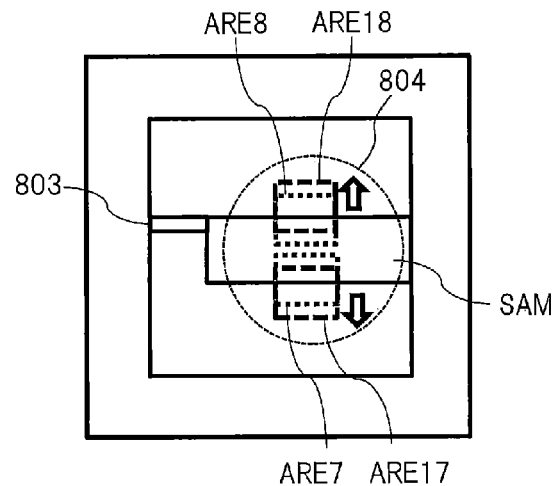

FIG. 9 is a schematic view of a thin film sample mounted on the TEM observation carrier. (a) of FIG. 9 shows an example of the thin film sample SAM when it is supported by a TEM observation carrier CARa (CAR) having a pillar 911. The thin film sample SAM and the pillar 911 are fixed by using deposition gas, for example. (a) of FIG. 9 shows a case in which one thin film sample SAM is supported by one pillar 911, but a plurality of thin film samples SAM may be supported by one pillar 911.

(b) of FIG. 9 shows an example of the thin film sample SAM when it is gripped by a TEM observation carrier CARb (CAR) having a clip shape. In (b) of FIG. 9, both ends of the thin film sample SAM are gripped by a clip 912 including a plurality of pillars, but the thin film sample SAM may be gripped by only one end. Further, the clip 912 may grip a plurality of thin film samples SAM stacked in the vertical direction.

(c) of FIG. 9 shows an example of the thin film sample SAM when it is supported by a TEM observation carrier CARc configured in a grid pattern. Specifically, a film such as a carbon film, a polymer film, or the like having a lamellar structure, for example, is stretched on the TEM observation carrier CARc, and one or a plurality of thin film samples SAM are supported on the film. This film does not have to be a uniform film, and may be a film having a large number of pores. Further, a plurality of thin film samples may be supported by one grid.
<Semiconductor Analysis Method>

Next, a semiconductor analysis method using the semiconductor analysis system 100 will be described. FIG. 10 is a flow chart showing an example of the semiconductor analysis method according to the first embodiment of the present invention. In FIG. 10, each process corresponding to the FIB-SEM device 101, the host control device 103, and the TEM device 102 is shown.

The semiconductor analysis process is started by transmitting an instruction from the host control device 103 to the FIB-SEM device 101 and the TEM device 102. When the semiconductor analysis process is started, first, the semiconductor wafer WAF and the TEM observation carrier CAR are conveyed into the FIB-SEM device 101 (step S1001).

Then, the FIB-SEM device 101 reads an ID of the conveyed semiconductor wafer WAF and an ID of the conveyed TEM observation carrier CAR (step S1002). The IDs include a barcode, a two-dimensional code, and the like, for example. The IDs are formed on a part of the semiconductor wafer WAF or the TEM observation carrier CAR by laser machining or the like. Then, the FIB-SEM device 101 outputs the read ID to inquire the corresponding FIB machining condition to the host control device 103 (step S1003).

The host control device 103 reads the FIB machining conditions from the memory 103*a* based on the ID output from the FIB-SEM device 101 (step S1004), and outputs the read FIB machining conditions to the FIB-SEM device 101 (step S1005).

The FIB-SEM device 101 sets thin film sample preparation conditions based on the FIB machining conditions output from the host control device (step S1006), and prepares the thin film sample SAM according to the set thin film sample preparation conditions (step S1007).

After preparing the thin film sample SAM, the FIB-SEM device 101 picks up the thin film sample SAM and conveys it to the TEM observation carrier CAR (step S1008). For the pickup of the thin film sample SAM, for example, the probe unit 312 or tweezers may be used.

Then, the TEM observation carrier CAR is taken out from the FIB-SEM device 101 (step S1009). The TEM observation carrier CAR may be taken out in a state of being stored in a dedicated case in the FIB-SEM device 101, or may be taken out in a state of being placed on a cartridge that can be attached to the TEM device 102.

The TEM observation carrier CAR taken out from the FIB-SEM device 101 is conveyed to the TEM device 102

(step S1010). Note that some or all of conveyance tasks of the TEM observation carrier CAR may be performed by human or robot.

Next, the TEM device 102 reads the ID of the conveyed TEM observation carrier CAR (step S1011). Then, the TEM device 102 outputs the read ID to inquire the corresponding TEM observation condition to the host control device 103 (step S1012).

The host control device 103 reads the TEM observation condition from the memory 103a based on the ID output from the TEM device 102 (step S1013), and outputs the read TEM observation condition to the TEM device 102 (step S1014).

The TEM device 102 sets the observation conditions of the thin film sample SAM based on the TEM observation conditions output from the host control device 103 (step S1015), and moves the TEM observation carrier CAR to a predetermined observation position (step S1016). Then, the TEM device 102 observes the thin film sample SAM under the set observation conditions (step S1017). Note that steps S1015 and S1016 may be processed with the processing sequences reversed, or may be performed in parallel. The TEM device 102 outputs the observation result of the thin film sample SAM to the host control device 103 (step S1018). The observation results include TEM images, detection data in each detector, and the like.

<<Evaluation of Thin Film Sample>>

The host control device 103 evaluates the thin film sample SAM based on an observation result output from the TEM device 102 (step S1019). Hereinafter, a method for measuring the thin film sample SAM will be described in detail. For example, the evaluation items for the thin film sample SAM include an amount of misalignment of the thin film machining area, an amount of thickness deviation of the film thickness, an amount of damage due to FIB machining, and the like.

First, the evaluation of the amount of misalignment of the thin film machining area will be described. To measure the position of the thin film machining area, CAD data or 3D reconstruction data of the observation area is prepared, and based on the CAD data or the 3D reconstruction data, the shapes of the thin film sample SAM at a plurality of locations in the observation area are prepared in advance as reference images. In addition, the 3D reconstruction data may be prepared by using electron tomography method of the TEM image, or may be prepared by repeating FIB machining and SEM observation.

The position detection unit 103b of the host control device 103 matches the TEM image or STEM image (observation result) output from the TEM device 102 with each of the plurality of reference images, and specifies a reference image that has the highest correlation value to detect the position of the thin film machining area (the position where the thin film sample SAM is prepared). In addition, the image matching algorithm may be a method for emphasizing edges, a method for extracting feature points, or a method of using shape information. Then, the position detection unit 103b compares the detected position of the thin film machining area with a set position of the thin film machining area, and calculates the amount of misalignment of the thin film machining area as the evaluation result.

Next, the evaluation of the amount of thickness deviation of the film thickness of the thin film sample SAM will be described. When the film thickness of the thin film sample SAM is thick, since structures behind the structure to be observed also appear in the TEM image or STEM image at the same time, the thickness detection unit 103c of the host control device 103 can count the number of structures in the TEM image or STEM image output from the TEM device 102 to calculate the film thickness of the thin film sample SAM. It is possible that the structures may overlap, but by inclining the thin film sample SAM, such overlap can be eliminated and the film thickness of the thin film sample SAM can be detected.

Further, when an HAADF-STEM image is used, the contrast of the HAADF-STEM image depends on the film thickness of the thin film sample SAM and the constituent atoms of the thin film sample SAM, in which the constituent atoms to be observed are almost the same in the thin film sample SAM. Therefore, the thickness detection unit 103c can calculate signal strength of the HAADF-STEM image to detect the film thickness of the thin film sample SAM.

For example, the relationship between the film thickness and the signal strength is measured or calculated in advance, and film thickness-signal strength information including the film thickness associated with the signal strength is stored in the memory 103a as a table, a function, or the like. Then, the thickness detection unit 103c detects the film thickness of the thin film sample SAM corresponding to the calculated signal strength based on the film thickness-signal strength information. Then, the thickness detection unit 103c compares the detected film thickness of the thin film sample SAM with a set film thickness, and calculates the amount of thickness deviation of the film thickness as the evaluation result.

Next, the evaluation of the amount of damage due to FIB machining will be described. When the FIB machining is performed, a damage layer is formed at an end of the thin film sample SAM such that the crystalline portion becomes amorphous. Observation of the Fast Fourier Transform (FFT) pattern of the TEM image or STEM image reveals that the crystal portion generally becomes a spot and the amorphous portion becomes a circular pattern. Therefore, the damage layer can be evaluated to be smaller as the strength of the circular pattern is weaker, and evaluated to be larger as the strength of the circular pattern is stronger.

Therefore, for example, the relationship between the strength of the circular pattern and the thickness of the damage layer in the FFT pattern of the TEM image or the STEM image is measured or calculated in advance, and circular pattern strength-damage layer information including the strength of the circular pattern associated with the thickness of the damage layer is stored in the memory 103a as a table, a function, or the like. Further, the memory 103a stores damage layer thickness-damage amount information including the thickness of the damage layer associated with the amount of damage.

The damage amount detection unit 103d calculates the thickness of the damage layer from the calculated circular pattern strength based on the circular pattern strength-damage layer information. Then, the damage amount detection unit 103d calculates the amount of damage from the calculated thickness of the damage layer based on the damage layer thickness-damage amount information.

In addition, the memory 103a may store pattern strength-damage amount information including the strength of the circular pattern associated with the amount of damage. In this case, the damage amount detection unit 103d can directly calculate the amount of damage from the strength of the circular pattern based on the pattern strength-damage amount information.

Next, step S1020 will be described. At step S1020, the FIB machining conditions are updated based on the evaluation result at step S1019.

<<Update of FIB Machining Conditions>>

At step S1020, the FIB machining conditions are updated based on the evaluation result of step S1019. FIG. 11 is a diagram illustrating a method for updating the FIB machining conditions. (a) of FIG. 11 is a diagram illustrating a method for updating FIB machining conditions based on the amount of misalignment of the thin film machining area. (b) of FIG. 11 is a diagram illustrating a method for updating FIB machining conditions based on the film thickness of the thin film sample. (c) and (d) of FIG. 11 are diagrams illustrating a method for updating the FIB machining conditions based on the amount of damage caused by the FIB machining.

First, the method for updating the FIB machining conditions based on the amount of misalignment of the thin film machining area will be described. When the amount of misalignment of the thin film machining area is less than a predetermined threshold for determining amount of misalignment, the FIB control unit 103e determines that it is not necessary to correct the position of the thin film machining area, and does not update the FIB machining conditions. On the other hand, when the amount of misalignment of the thin film machining area is equal to or greater than the predetermined threshold for determining amount of misalignment, the FIB control unit 103e determines that the position of the thin film machining area needs to be corrected, and updates the FIB machining conditions.

In the thin film sample SAM shown in (a) of FIG. 11, FIB machining is performed in thin film machining areas ARE1 and ARE2. On the other hand, the set thin film machining areas corresponding to the thin film machining areas ARE1 and ARE2 are ARE11 and ARE12, respectively.

For example, when the amount of misalignment of the thin film machining area ARE1 with respect to the set thin film machining area ARE11 is equal to or greater than the threshold for determining amount of misalignment, for the subsequent semiconductor wafers WAF, the FIB control unit 103e updates the FIB machining conditions such that the thin film machining area ARE1 is changed to the set thin film machining area ARE11. That is, the position detection unit 103b updates the FIB machining conditions so as to shift the thin film machining area ARE1 by the calculated amount of misalignment.

The same applies to the thin film machining area ARE12 such that, for example, when the amount of misalignment of the thin film machining area ARE2 with respect to the set thin film machining area ARE12 is equal to or greater than the threshold for determining amount of misalignment, for the subsequent semiconductor wafers WAF, the FIB control unit 103e updates the FIB machining conditions such that the thin film machining area ARE2 is changed to the thin film machining area ARE12.

When the amount of misalignment is determined in a plurality of thin film machining areas (e.g., ARE1 and ARE2) of one thin film sample SAM, the FIB control unit 103e may update the FIB machining conditions so as to shift each thin film machining area in the same direction as shown in (a) of FIG. 11, or may update the FIB machining conditions so as to shift the thin film machining areas in directions different from each other.

When shifting each thin film machining area in the same direction, the shift amount of all thin film machining areas may be the same. For example, an average value of amounts of misalignment of all the thin film machining areas may be calculated by the position detection unit 103b or the FIB control unit 103e and this average value may be used as the shift amount, or a maximum or minimum value of the amounts of misalignment of all the thin film machining areas may be used as the shift amount. Note that, although only two thin film machining areas ARE1 and ARE2 are shown in (a) of FIG. 11, the number of machining areas is not particularly limited.

Next, a method for updating the FIB machining conditions based on the amount of thickness deviation of the film thickness of the thin film sample SAM will be described. When the amount of thickness deviation of the film thickness of the thin film sample SAM calculated by the thickness detection unit 103c is less than a predetermined threshold for determining amount of thickness deviation, the FIB control unit 103e determines that it is not necessary to correct the film thickness of the thin film sample SAM, and does not update the FIB machining conditions. On the other hand, when the amount of thickness deviation of the film thickness of the thin film sample SAM is equal to or greater than the threshold for determining amount of thickness deviation, the FIB control unit 103e determines that the film thickness of the thin film sample SAM needs to be corrected, and updates the FIB machining conditions.

In the thin film sample SAM shown in (b) of FIG. 11, the FIB machining is performed in the thin film machining areas ARE3 and ARE4. Meanwhile, when the thin film sample SAM is machined to set film thickness, the set thin film machining areas are ARE13 and ARE14 or its vicinity, for example. In (b) of FIG. 11, the thin film machining areas ARE3 and ARE4 are displaced outward from the set thin film machining areas ARE13 and ARE14. Therefore, the amount of thickness deviation of the film thickness of the thin film sample SAM calculated by the thickness detection unit 103c is equal to or greater than the threshold for determining amount of thickness deviation.

Therefore, the FIB control unit 103e updates the FIB machining conditions so as to shift the thin film machining areas such that the two thin film machining areas ARE3 and ARE4 are close to each other. At this time, the shift amount of each of the thin film machining areas ARE3 and ARE4 may each be set to a half the calculated amount of thickness deviation, for example.

On the other hand, when the amount of thickness deviation is greater than the threshold for determining amount of thickness deviation because of the thickness of the film thickness of the thin film sample SAM being thin (small), the FIB control unit 103e may update the FIB machining conditions such that the two thin film machining areas ARE3 and ARE4 are separated away from each other. Also in this case, the shift amount of the thin film machining areas ARE3 and ARE4 may each be set to a half the calculated amount of thickness deviation, for example. Note that, although only two thin film machining areas ARE3 and ARE4 are shown in (b) of FIG. 11, the number of machining areas is not particularly limited.

Next, a method for updating the FIB machining conditions based on the amount of damage caused by the FIB machining will be described. When the amount of damage calculated by the damage amount detection unit 103d is less than a predetermined threshold for determining amount of damage, the FIB control unit 103e determines that it is not necessary to update the FIB machining conditions. On the other hand, when the amount of damage is equal to or greater than the threshold for determining amount of damage, the FIB control unit 103e determines that it is necessary to correct the position of the thin film machining area, and updates the FIB machining conditions.

In order to reduce the damage to the thin film sample SAM due to FIB machining, it is effective to lower the acceleration voltage when performing finish machining. Therefore, the FIB control unit 103e sets the finish machining areas for the thin film sample SAM to ARE5 and ARE6 as shown in (c) of FIG. 11, and updates the FIB machining conditions so as to lower the acceleration voltage for these finish machining areas ARE5 and ARE6.

Alternatively, as shown in (d) of FIG. 11, the FIB control unit 103e changes the FIB machining conditions so as to shift the two thin film machining areas ARE7 and ARE8 before finish machining to the thin film machining areas ARE17 and ARE18, respectively, so that the thin film machining areas ARE7 and ARE8 are separated away by a preset distance. Further, the FIB control unit 103e changes the FIB machining conditions such that the finish machining is performed at a low acceleration voltage as shown in (c) of FIG. 11. The finish machining area corresponding to the low acceleration voltage may be set to cover the thin film machining areas ARE17 and ARE18, for example, or may be set to cover at least the front surface and the back surface of the thin film sample SAM.

By increasing the area for finish machining at low acceleration voltage, the amount of damage due to machining can be reduced. Although only two machining areas are shown in (c) and (d) of FIG. 11, the number of machining areas is not particularly limited.

The host control device 103 rewrites the FIB machining conditions stored in the memory 103a to the updated FIB machining conditions. Further, the host control device 103 outputs the updated FIB machining conditions to the FIB-SEM device 101. The FIB-SEM device 101 changes the FIB machining conditions to the FIB machining conditions output from the host control device 103.

In the present embodiment, for example, the ALTS device 201 described with reference to FIGS. 2 and 4 may be used to transfer the thin film sample SAM from the semiconductor wafer WAF to the TEM observation carrier CAR and observe the thin film sample SAM. The host control device 103 can update the FIB machining conditions based on the observation results of the ALTS device 201 and the TEM device 102.

Main Effects of Present Embodiment

According to the present embodiment, the host control device 103 evaluates the thin film sample SAM based on the TEM image, and updates the machining conditions based on the evaluation result of the thin film sample SAM. According to this configuration, since the observation result of the thin film sample SAM by the TEM device 102 can be fed back to the FIB-SEM device 101 to change the FIB machining conditions, for the subsequent semiconductor wafers WAF, it is possible to improve the accuracy of automatic preparation of the thin film samples and the accuracy of automatic observation of the thin film samples.

Specifically, when there is a misalignment in the preparation position of the thin film sample, it may take time to search for the TEM observation area, resulting in failure to complete the automatic observation within a target time, or failure of the automatic observation due to the loss of the observation target itself. Further, it is probable that the same misalignment occurs in the thin film samples prepared on the same semiconductor wafer. In such a case, by feeding back the amount of misalignment obtained in the preceding thin film sample to the FIB machining of the subsequent thin film sample, it is possible to shorten the time for searching for the observation area and successfully obtain thin film of the observation target, thereby improving the success rate of automatic observation.

Further, according to the present embodiment, the host control device 103 detects the position of the thin film machining area in the thin film sample SAM from the TEM image, compares the detected position of the thin film machining area with the set position of the thin film machining area, and calculates the amount of misalignment of the detected position with respect to the set position as the evaluation result of the thin film sample. According to this configuration, it is possible to correct the machining area based on the evaluation result.

Further, according to the present embodiment, the host control device 103 updates the machining conditions when the amount of misalignment of the thin film machining area is equal to or greater than the threshold for determining amount of misalignment. According to this configuration, the number of updates of the FIB machining conditions can be reduced.

Further, according to the present embodiment, the host control device 103 detects the film thickness of the thin film sample SAM from the TEM image, compares the detected film thickness of the thin film sample SAM with the set film thickness, and calculates the amount of thickness deviation of the detected film thickness with respect to the set film thickness as the evaluation result. According to this configuration, it is possible to correct the machining area and thus the film thickness based on the evaluation result.

Further, according to the present embodiment, the host control device 103 updates the machining conditions when the amount of thickness deviation of the detected film thickness is equal to or greater than the threshold for determining amount of thickness deviation. According to this configuration, the number of updates of the FIB machining conditions can be reduced.

Further, according to the present embodiment, the host control device 103 calculates the amount of damage of the thin film sample SAM due to machining from the TEM image as the evaluation result. According to this configuration, it is possible to correct the acceleration voltage and the like based on the evaluation result.

Further, according to the present embodiment, the host control device 103 updates the machining conditions when the amount of damage of the thin film sample SAM is equal to or greater than the threshold for determining amount of damage. For example, the host control device 103 updates the machining conditions so as to lower the acceleration voltage. According to this configuration, the number of updates of the FIB machining conditions can be reduced.

Further, according to the present embodiment, the TEM device 102 acquires a STEM image. According to this configuration, an image that cannot be acquired by the TEM image can be obtained, and it is possible to make a more accurate evaluation of the thin film sample SAM.

Second Embodiment

Next, the second embodiment will be described. Note that, basically, the descriptions of the elements overlapping with those in the embodiments described above will be omitted.

At the time of thin film machining, although end point detection is performed using SEM images, due to the miniaturization of the device, it is difficult to determine whether or not the machining end point is successfully detected until the observation is actually performed using the TEM device after the FIB thin film is machined. Therefore, in the present embodiment, the pass or fail of the thin film sample is determined using the TEM image, and the TEM image (or STEM image) and the SEM image at the machining end point are associated with each other and learned by a learning device, thereby improving detection accuracy of the machining end point.

FIG. 12 is a diagram illustrating a semiconductor analysis system according to the second embodiment of the present invention. The host control device 103 of the present embodiment includes a determination unit 1201, a learning device 1202, and a machining control unit 1203, in addition to the configuration shown in FIG. 1.

The determination unit 1201 is a functional block that performs a pass or fail determination process (a first pass or fail determination process) of the machining end point detection for the FIB machining on the thin film sample SAM, based on the TEM image (STEM image) after FIB machining (that is, after preparation of thin film sample SAM), which is output from the TEM device 102. As shown in FIG. 12, the determination unit 1201 outputs a pass or fail determination result (a first pass or fail determination result) of the machining end point detection for each thin film sample SAM to the learning device 1202 based on the TEM image (STEM image) of each thin film sample SAM. The determination unit 1201 may be configured by hardware or software, or may be configured by combining hardware and software.

The learning device 1202 is a functional block that generates a learning model for performing the machining end point detection by comparing the pass or fail determination result of the machining end point detection in the determination unit 1201 with the SEM image in the FIB-SEM device 101. Note that FIG. 12 illustrates learning process using the input data of first to third thin film samples, but the number of input data is not limited thereto. The learning device may be configured by hardware or software, or may be configured by combining hardware and software. Further, the learning device 1202 may be configured by Artificial Intelligence (AI), for example. By AI, the machine learning utilizing deep learning or the like is implemented.

The machining control unit 1203 is a functional block that performs processing related to FIB machining. The machining control unit 1203 may be included in a control unit (not shown) that controls the host control device 103, or may be provided separately from the control unit, for example.

<Method for Updating Learning Model>

FIG. 13 is a flow chart showing an example of a method for updating training data according to the second embodiment of the present invention. Again, in FIG. 13, each process corresponding to the FIB-SEM device 101, the host control device 103, and the TEM device 102 is shown.

Steps S1001 to S1006 are the same as in FIG. 10. After step S1006, step S1301 is executed. At step S1306, thin film machining (that is, thin film sample preparation) is performed according to the machining conditions set at step S1006.

At step S1302, while performing the thin film machining at step S1301, the FIB-SEM device 101 acquires an SEM image of the area where the thin film machining is performed (step S1302), and outputs the acquired SEM image to the host control device 103 (step S1303).

At step S1304, the machining control unit 1203 of the host control device 103 determines the machining end point based on the SEM image output from the FIB-SEM device 101. The determination of the machining end point is performed by matching the SEM image with the reference image prepared in advance. When these images do not match with each other (NO), the machining control unit 1203 determines that the thin film machining is insufficient, and instructs the FIB-SEM device 101 to shift the machining position and continues machining. Then, steps S1301 to S1303 are executed again.

On the other hand, at step S1304, when the images match with each other (YES), the machining control unit 1203 determines that the thin film machining is sufficient and ends the thin film machining. Further, the machining control unit 1203 stores the SEM image at this time as a machining end point image in the memory 103a (step S1305). Further, the machining control unit 1203 outputs the machining end point image (SEM image) to the FIB-SEM device 101 (step S1306).

Steps S1008 to S1019 are the same as in FIG. 10. At step S1018, the TEM device 102 outputs the TEM images (STEM images) after thin film machining of a plurality of thin film samples SAM to the host control device 103 as input data. Then, at step S1019, the host control device 103 evaluates the plurality of thin film samples SAM based on the TEM images (STEM images). After step S1019, step S1307 is executed.

At step S1307, the host control device 103 determines the pass or fail of the machining end point detection for each TEM image based on the evaluation result at step S1019, and updates the training data. The evaluation items at step S1019 include the position (amount of misalignment) of the thin film machining area, the amount of thickness deviation of the film thickness of the thin film sample SAM, the amount of damage due to the thin film machining, and the like, for example.

First, the determination unit 1201 performs the pass or fail determination process (the first pass or fail determination process) of the machining end point detection for each thin film sample SAM using the TEM image output from the TEM device 102, and outputs the pass or fail determination result (the first pass or fail determination result) to the learning device 1202. Further, the SEM image corresponding to each TEM image is input to the learning device 1202. However, since this SEM image is an SEM image that matches the reference image and is stored in the memory 103a, the learning device 1202 may read out the SEM image corresponding to the TEM image for which the pass or fail determination is performed from the memory 103a, if necessary.

The learning device 1202 associates the input TEM image with the SEM image, and learns the state when the detection of the machining end point is successful by associating the TEM image determined to have a good machining end point detection with the SEM image. Meanwhile, the learning device 1202 learns the state when the detection of the machining end point is failed by associating the TEM image determined to have a bad machining end point detection with the SEM image. By repeating such learning, the learning device 1202 updates the learning model.

<Determination of Machining End Point Detection Using Learning Model>

FIG. 14 is a diagram illustrating a method for determining the machining end point detection using the learning model. In FIG. 14, for convenience of description, only the FIB-SEM device 101 and the host control device 103 are shown.

When performing thin film machining (preparation of a thin film sample SAM), the FIB-SEM device 101 outputs an SEM image at the time of thin film machining to the learning device 1202 having a learning model.

For example, at step S1304, the learning device 1202 performs a pass or fail determination process (a second pass or fail determination process) of the machining end point detection with respect to the SEM image output from the FIB-SEM device 101 by using the learning model. Then, the learning device 1202 outputs a pass or fail determination result (a second pass or fail determination result) of the machining end point detection for the thin film sample SAM based on this SEM image to the machining control unit 1203. Then, the machining control unit 1203 gives an instruction to continue or end machining to the FIB-SEM device 101 based on the pass or fail determination result of the machining end point detection. Specifically, when the pass or fail determination result is negative, the machining control unit 1203 instructs the FIB-SEM device 101 to continue the FIB machining. On the other hand, when the pass or fail determination result is affirmative, the machining control unit 1203 instructs the FIB-SEM device 101 to end the FIB machining.

Main Effects of Present Embodiment

In the present embodiment, in addition to the effects of the embodiment described above, the following effects can be obtained. According to the present embodiment, the learning device 1202 performs the pass or fail determination process (the second pass or fail determination process) of the machining end point detection on the thin film sample SAM based on the SEM image using the learning model, and the machining control unit 1203 gives an instruction to the machining device to continue or end machining based on the pass or fail determination result of the machining end point detection in the learning device 1202.

In the end point detection using SEM images, which is usually performed at the time of thin film machining, due to the miniaturization of the device, it is difficult to determine whether or not the machining end point detection is successful until the observation is actually performed using the TEM device 102, but by having the learning device 1202 learn the results of TEM observation as the training data, it is possible to improve the accuracy of the end point detection by the SEM image at the time of thin film machining.

It is to be noted that the present invention is not limited to the embodiments described above, and includes various modified examples. Further, a part of the configuration of an embodiment can be replaced with the configuration of another embodiment, and the configuration of another embodiment can be added to the configuration of an embodiment.

In addition, it is possible to add, delete, and replace other configurations for a part of the configuration of each embodiment. It should be noted that each member and the relative size described in the drawings are simplified and idealized in order to describe the present invention in an easy-to-understand manner, and may have a more complicated shape when implemented.

REFERENCE SIGNS LIST

100, 200: semiconductor analysis system
101: FIB-SEM device
102: TEM device
103: host control device
201: ALTS device
1201: determination unit
1202: learning device
1203: machining control unit
CAR: TEM observation carrier
SAM: thin film sample
WAF: semiconductor wafer

The invention claimed is:

1. A semiconductor analysis system comprising:
a machining device that machines a semiconductor wafer to prepare a thin film sample for observation;
a transmission electron microscope device that acquires a transmission electron microscope image of the thin film sample;
a host control device that controls the machining device and the transmission electron microscope device, wherein the host control device evaluates the thin film sample based on the transmission electron microscope image, updates machining conditions based on an evaluation result of the thin film sample, and outputs the updated machining conditions to the machining device; and
wherein:
the machining device includes a scanning electron microscope device that acquires a scanning electron microscope image;
the host control device includes a determination unit that performs a first pass or fail determination process of machining end point detection for the thin film sample based on the transmission electron microscope image, a learning device that generates a learning model for performing the machining end point detection by comparing a first pass or fail determination result of the machining end point detection in the determination unit with the scanning electron microscope image, and a machining control unit;
the learning device uses the learning model to perform a second pass or fail determination process of the machining end point detection for the thin film sample based on the scanning electron microscope image; and
the machining control unit gives an instruction to the machining device to continue machining or end machining based on the second pass or fail determination result of the machining end point detection in the learning device.

2. The semiconductor analysis system according to claim 1, wherein the host control device detects from the transmission electron microscope image a position of a thin film machining area in the thin film sample, compares the detected position of the thin film machining area with a set position of the thin film machining area, and calculates an amount of misalignment of the detected position with respect to the set position as the evaluation result of the thin film sample.

3. The semiconductor analysis system according to claim 2, wherein, when the amount of misalignment of the thin film machining area is equal to or greater than a threshold for determining amount of misalignment, the host control device updates the machining conditions.

4. The semiconductor analysis system according to claim 1, wherein the host control device detects from the transmission electron microscope image a film thickness of the thin film sample, compares the detected film thickness of the thin film sample with a set film thickness, and calculates an amount of thickness deviation of the detected film thickness with respect to the set film thickness as the evaluation result.

5. The semiconductor analysis system according to claim 4, wherein, when the amount of thickness deviation of the detected film thickness is equal to or greater than a threshold for determining amount of thickness deviation, the host control device updates the machining conditions.

6. The semiconductor analysis system according to claim 1, wherein the host control device calculates, from the transmission electron microscope image, an amount of damage of the thin film sample due to machining as the evaluation result.

7. The semiconductor analysis system according to claim 6, wherein, when the amount of damage of the thin film sample is equal to or greater than a threshold for determining amount of damage, the host control device updates the machining conditions.

8. The semiconductor analysis system according to claim 1, wherein the transmission electron microscope device acquires a scanning transmission electron microscope image as the transmission electron microscope image.

9. A semiconductor analysis system comprising:
 a machining device that machines a semiconductor wafer to prepare a thin film sample for observation;
 a transmission electron microscope device that acquires a transmission electron microscope image of the thin film sample;
 a host control device that controls the machining device and the transmission electron microscope device, wherein the host control device evaluates the thin film sample based on the transmission electron microscope image, updates machining conditions based on an evaluation result of the thin film sample, and outputs the updated machining conditions to the machining device;
 wherein the host control device calculates, from the transmission electron microscope image, an amount of damage of the thin film sample due to machining as the evaluation result;
 wherein, when the amount of damage of the thin film sample is equal to or greater than a threshold for determining amount of damage, the host control device updates the machining conditions;
 wherein the host control device updates the machining conditions to lower an acceleration voltage.

* * * * *